United States Patent
Huang et al.

(10) Patent No.: US 7,312,136 B2
(45) Date of Patent: Dec. 25, 2007

(54) METHOD OF FABRICATING A WAFER WITH STRAINED CHANNEL LAYERS FOR INCREASED ELECTRON AND HOLE MOBILITY FOR IMPROVING DEVICE PERFORMANCE

(75) Inventors: Chien-Chao Huang, Hsin-Chu (TW); Yee-Chia Yeo, Singapore (SG); Kuo-Nan Yang, Taipei (TW); Chun-Chieh Lin, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/899,270

(22) Filed: Jul. 26, 2004

(65) Prior Publication Data
US 2004/0266137 A1 Dec. 30, 2004

Related U.S. Application Data

(62) Division of application No. 10/318,454, filed on Dec. 13, 2002, now Pat. No. 6,812,116.

(51) Int. Cl.
*H01L 21/20* (2006.01)
(52) U.S. Cl. ............... 438/478; 438/458; 438/285; 257/E21.182; 257/E21.103; 257/E21.618
(58) Field of Classification Search ........... 438/404, 438/406, 409, 464, 458, 466, 960, 459, 479, 438/509, FOR. 394, 289, 478; 257/E21.568, 257/E21.57, 194, 289, E21.182, E21.103, 257/E21.618
See application file for complete search history.

(56) References Cited

U.S. PATENT DOCUMENTS

| 5,759,898 | A | 6/1998 | Ek et al. |
| 6,107,653 | A | 8/2000 | Fitzgerald |
| 6,143,629 | A | 11/2000 | Sato |
| 6,294,478 | B1 | 9/2001 | Sakaguchi et al. |
| 6,633,066 | B1 | 10/2003 | Bae et al. |
| 6,828,214 | B2 * | 12/2004 | Notsu et al. ............. 438/455 |
| 2002/0127820 | A1 * | 9/2002 | Sato ........................ 438/458 |
| 2004/0224482 | A1 * | 11/2004 | Kub et al. ............... 438/458 |

OTHER PUBLICATIONS

Wolf et al., Silicon Processing for the VLSI Era, vol. 1: Process Technology, 1986, by Lattice Press, pp. 23-25.*

* cited by examiner

*Primary Examiner*—Matthew Smith
*Assistant Examiner*—Julio J. Maldonado
(74) *Attorney, Agent, or Firm*—Haynes Boone, LLP

(57) ABSTRACT

A method for making a SOI wafer with a strained silicon layer for increased electron and hole mobility is achieved. The method forms a porous silicon layer on a seed wafer. A $H_2$ anneal is used to form a smooth surface on the porous silicon. A strain free (relaxed) epitaxial $Si_xGe_{1-x}$ layer is deposited and a bonding layer is formed. The seed wafer is then bonded to a handle wafer having an insulator on the surface. A spray etch is used to etch the porous Si layer resulting in a SOI handle wafer having portions of the porous Si layer on the relaxed $Si_xGe_{1-x}$. The handle wafer is then annealed in $H_2$ to convert the porous Si to a smooth strained Si layer on the relaxed SiGe layer of the SOI wafer.

20 Claims, 3 Drawing Sheets

METHOD OF FABRICATING A WAFER WITH STRAINED CHANNEL LAYERS FOR INCREASED ELECTRON AND HOLE MOBILITY FOR IMPROVING DEVICE PERFORMANCE

CROSS-REFERENCE

This application is a divisional application of U.S. patent application Ser. No. 10/318,454, filed on Dec. 13, 2002, now U.S. Pat. No. 6,812,116, entitled.

BACKGROUND

The present invention relates to a method for making a semiconductor substrate having a strained silicon layer for improved device performance. More particularly the method utilizes a porous silicon layer and a relaxed silicon germanium (SiGe) layer to achieve a strained Si layer for improved device performance (mobility). One application of this strained layer is to improve the channel mobility for FETs in CMOS applications on Silicon-On-Insulator (SOI) substrates (also referred to as wafers).

DESCRIPTION OF THE PRIOR ART

In past years silicon semiconductor devices such as bipolar transistors, FETs were reduced in size to improve device performance. The devices were scaled in both the vertical direction and horizontal direction using improved photolithographic and directional plasma etching techniques and self-aligning techniques. As the minimum features sizes of the devices decrease, the spacings between the metal lines used to wire up the devices decrease and there is a corresponding increase in pitch. This closer spacing results in increased RC time constants. To achieve further improvements in performance, it is necessary to utilize low-dielectric insulators and higher conducting metallurgies, such as copper, to reduce the RC time constant of the circuit. Further increase in performance is achieved by using a Silicon-On-Insulator to minimize the capacitive coupling of the semiconductor devices to the substrate and also to improve the radiation hardening for the devices.

As the minimum features sizes and wiring pitch approach their limits, it is necessary to explore other methods to improve device performance. One approach is to form strained silicon layers on silicon germanium semiconductors to modify the silicon band structure resulting in higher electron and hole mobility.

Several methods of fabricating wafers using SiGe to increase current mobility have been reported in the literature. For example, Ek et al., U.S. Pat. No. 5,759,898, show a method for making a substrate in which a thin silicon layer is used as a buffer layer for forming a relaxed SiGe layer having reduced crystalline defects. Then a strained silicon layer is formed on the relaxed SiGe layer. Devices having higher electron mobility are formed in the strained silicon layer. U.S. Pat. No. 6,107,653 to Fitzgerald shows a method of forming a Ge layer with minimal defects on a <001> silicon substrate using a series of graded GeSi layers having planarization steps in between. The grading of the GeSi layers and the planarization control dislocation densities. This allows a 100% Ge layer to be formed on a Si substrate without an increase in threading dislocation densities. Sato, U.S. Pat. No. 6,143,629, teaches a process for making a smooth single-crystal layer on the surface of a porous silicon layer, which allows Sato to grow an epitaxial Si layer, which results in fewer stacking faults. Sato does not address forming a relaxed SiGe layer or a strained Si layer. Sakaguchi et al., U.S. Pat. No. 6,294,478 B1, teach a process for forming a silicon-on-insulator substrate. The method utilizes a process in which a first Si substrate has a porous Si layer. A non-porous thin Si film is formed through the porous Si layer, and a second substrate is bonded to the first substrate. The porous Si is removed to separate the two substrates.

There is still a need in the semiconductor industry to improve upon the process for making strained silicon layers on a silicon germanium film for silicon-on-insulator substrates to increase electron and hole mobility, and using a cost-effective manufacturing process.

SUMMARY

A principal object of this invention is to provide a strained silicon layer having increased electron and hole mobility on a silicon-on-insulator substrate for making semiconductor devices.

A second object of the present invention is to use a sacrificial layer that is mechanically weak, such as a porous silicon layer, with an overlying relaxed SiGe layer to form the strained silicon layer on a seed wafer.

A further object of this invention is to bond a handle wafer to the seed wafer, and to etch and separate the wafers at the sacrificial layer to expose the strained Si layer.

In summary, by a first embodiment, the objects of the present invention for making a strained silicon layer on a SOI wafer (handle wafer) begins by providing a polished silicon wafer (seed wafer) having an automatically smooth principal surface. A sacrificial layer, such as a porous silicon layer, is formed on and in the principal surface of the seed wafer, for example, by local anodization. The sacrificial layer is processed to form a smooth surface. If the mechanically week layer is porous silicon, the smooth surface may be formed by high temperature (for example, >1000° C.) annealing in hydrogen ambient. A relaxed silicon germanium layer is formed on the smoothed surface of the sacrificial layer, for example, by growing an epitaxial layer. Next, an epitaxial silicon layer is grown on the SiGe layer to provide a bonding surface for bonding the seed wafer to a handle wafer. Then, a handle wafer having an insulator on a principal surface is bonded to the epitaxial silicon layer on the seed wafer. The sacrificial layer is etched to separate the seed wafer from the handle wafer and to expose portions of the sacrificial layer and the smoothed silicon layer on the surface of the relaxed SiGe layer, which is now on the insulator of the handle wafer. A second anneal is used to anneal the porous Si layer on the handle wafer and to form a smooth strained Si layer on the underlying SiGe layer. This completes the silicon-on insulator having the strained silicon layer on a principal surface.

A second embodiment of this invention is similar to the first embodiment. The difference is that a silicon oxide (SiO$_2$) layer is formed on the relaxed SiGe surface and is used instead of a Si epitaxial layer as the bonding layer on the seed wafer.

A third embodiment of this invention is similar to the first embodiment. The difference is that a SiO$_2$ layer is formed on the Si epitaxial layer on the relaxed SiGe surface to provide a bonding layer on the seed wafer.

BRIEF DESCRIPTION OF THE DRAWINGS

The objects and other advantages of this invention are best understood with reference to the preferred embodiments when read in conjunction with the following drawings.

FIGS. 1 through 7 show schematic cross-sectional views of a portion of a wafer and depict the sequence of process steps for fabricating a strained silicon layer on a silicon-on-insulator (SOI) wafer.

WRITTEN DESCRIPTION

Figure 1:
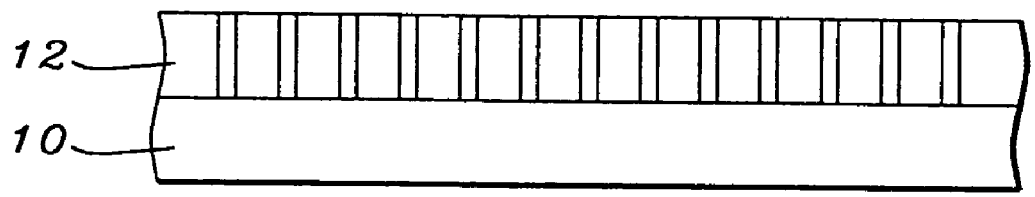

A novel method for making a strained Si layer, having increased electron and hole mobility, on a SOI wafer is now described in detail. Referring to FIG. 1, by a first embodiment, the process begins by providing a silicon wafer 10 that can be doped or undoped. The preferred wafer has a <100> crystallographic orientation. Alternatively, silicon wafers having <110> or <111> orientation can also be used. At least one surface of the wafer 10 is polished, for example by chemical-mechanical polishing, to provide an automatically smoother surface. A porous Si layer 12 is formed on and in the principal surface of the seed wafer. For example, the porous layer 12 can be formed by anodization. The anodization can be formed in an electrochemical cell using an anodizing solution consisting of hydrogen peroxide, hydrofluoric acid (HF 49% by volume), and methanol (98% by volume). With the Si wafer acting as the anode and a platinum wire acting as the cathode, the anodizing current density is between about 1 to 10 milliAmps/cm$^2$. The porous Si layer 12 is formed to a preferred depth of between about 100 and 10000 Angstroms in the surface of the seed wafer 10.

Figure 2:
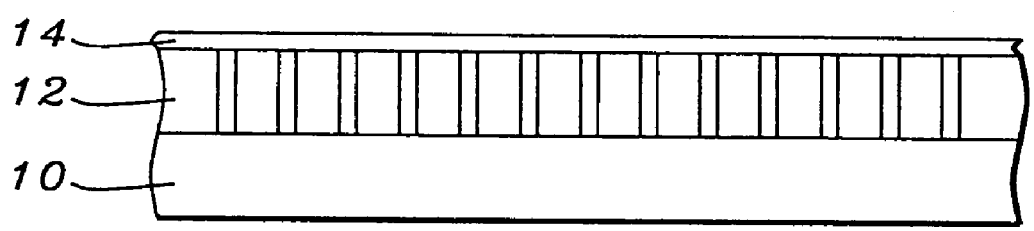

Referring to FIG. 2, the seed wafer 10 is thermally annealed for a time sufficient to form a Si layer 14 having a smooth surface and having a thickness of between about 2 and 1000 Angstroms on the porous Si layer 12. The annealing is carried out preferably in a furnace using hydrogen gas at a pressure of about $10^{-7}$ to 800 Torr and at a temperature of between about 900 and 1150° C.

Figure 3:
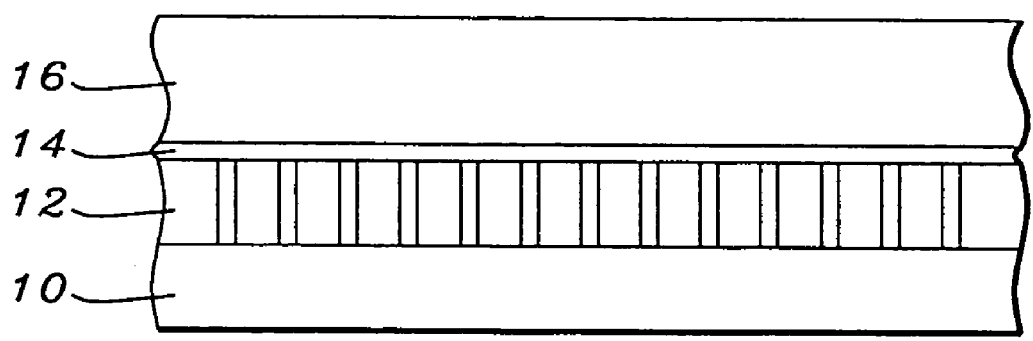

Referring to FIG. 3, a relaxed silicon germanium ($Si_xGe_{1-x}$) layer 16 is formed on the smoothed surface 14 of the porous Si layer 12. The SiGe layer 16 can be formed, for example, by chemical-vapor deposition and using a reactant gas mixture such as silane ($SiH_4$), germane ($GeH_4$), and dichlorosilane ($SiCl_2H_4$). The Ge profile in layer 16 can be uniform, or step-graded. The $Si_xGe_{1-x}$ is deposited to a thickness of between about 100 and 100000 Angstroms. The relaxed silicon germanium layer is deposited to have a concentration x of about 0.05 to 1.0.

Figure 4A:
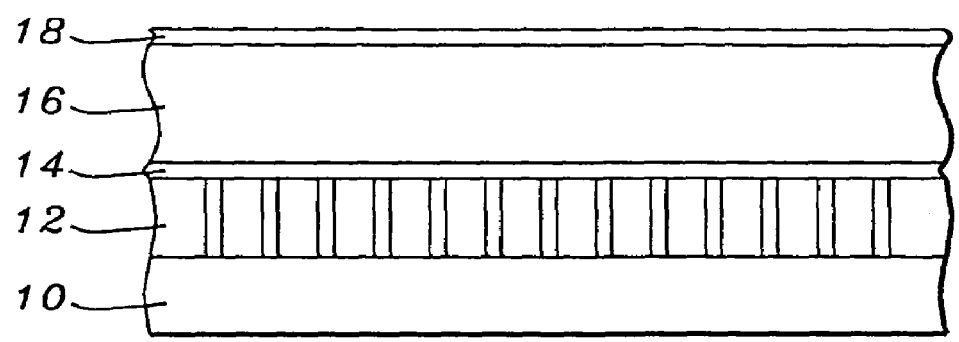
FIG. 4A shows a schematic cross-sectional view of a portion of a wafer depicting the process for fabricating a strained Si layer on a SOI wafer by a first embodiment.

Referring to FIG. 4A, and by a first embodiment, an exitaxial Si layer 18 is deposited on the SiGe layer 16. Layer 18 is also deposited using an epitaxial system such as a chemical-vapor deposition system. The layer 18 can be deposited sequentially in the same system after depositing the SiGe layer 16. Layer 18 provides a bonding surface for bonding the seed wafer 10 to a handle wafer 100, as shown in FIG. 5.

Figure 5:
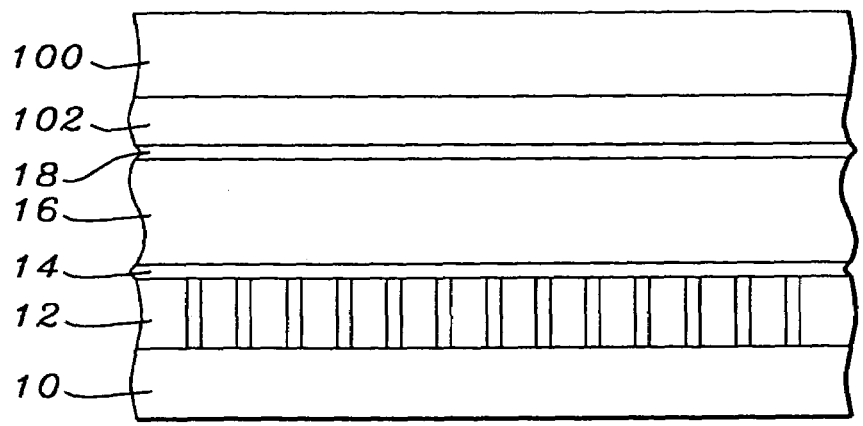

Continuing now with FIG. 5, the handle wafer 100 is also a single-crystal-silicon substrate with a preferred crystallographic orientation of <100>. The handle wafer 100 has an insulator 102 on a principal surface. The insulator 102 is preferably a thermally grown $SiO_2$. The $SiO_2$ 102 is grown in an oxidation furnace to a thickness of between about 0 and 1000 Angstroms. As shown in FIG. 5, the handle wafer 100 is bonded to the epitaxial Si layer 18 on a principal surface of the seed wafer 10. The bonding between the $SiO_2$ layer 102 and the epitaxial Si layer 18 is carried out by wafer-bonding techniques as commonly practiced in the industry. Common techniques include anodic bonding and electrostatic bonding, where the surfaces to be bonded are brought together and heated to a temperature of about 100 to 300° C. A larger electric field is applied across the joint causing an extremely strong bond to form at the interface.

Figure 6:
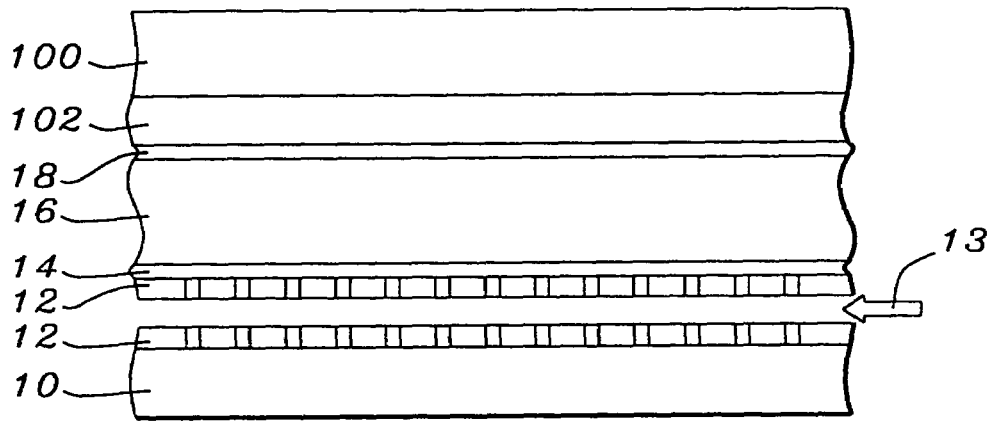

Referring to FIG. 6, the porous Si layer 12 is etched to separate the seed wafer 10 from the handle wafer 100. For example, the wafers are separated using a water-jet splitting process, as indicated by the horizontal arrow 3. More specifically, the water-jet splitting process is carried out by a process known and used in the industry. The water-jet splitting process uses a jet stream with directivity to apply stress and penetrate a plane of separation at the mechanically weak layer.

Figure 7:
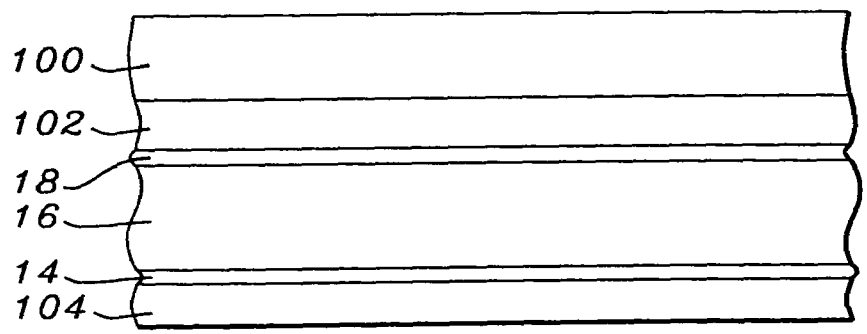

Referring to FIG. 7, after the wafers 10 and 100 are separated, the remaining portions of the porous Si layer 12 on the handle wafer 100 are annealed in hydrogen to form a strained Si layer 104 on the unstrained (relaxed) SiGe layer 16 to complete the SOI handle wafer. The handle wafer containing the porous Si layer 12 and the underlying smoothed Si layer 14 are annealed preferably in hydrogen at a temperature of about 900 to 1150° C. for a time sufficient to form the strained Si layer 104 and concurrently to form a smooth surface on layer 104. The preferred thickness of layer 104 is between 10 and 1000 Angstroms. This completes the silicon-on insulator having the strained silicon layer on a principal surface for fabricating semiconductor devices having increased electron and hole mobility.

Figure 4B:
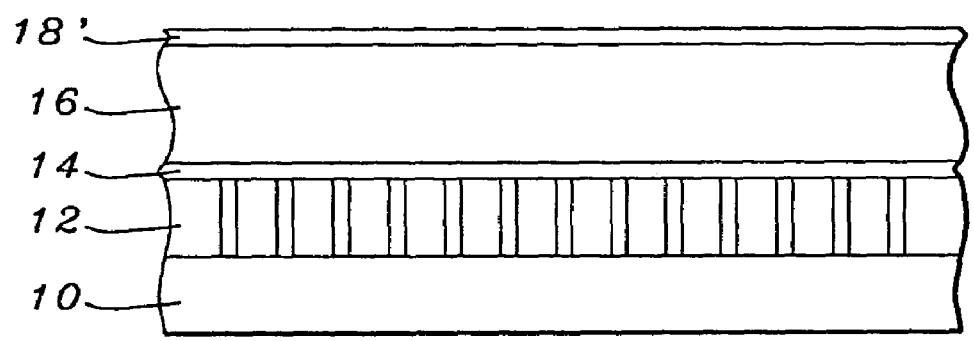
FIG. 4B shows a schematic cross-sectional view of a portion of a wafer depicting the process for fabricating a strained Si layer on a SOI wafer by a second embodiment.

Referring to FIG. 4B, a second embodiment is now described. This embodiment is similar to the first embodiment up to FIG. 4A, except that the bonding epitaxial layer 18 shown in FIG. 4A is replaced in the process steps by a bonding $SiO_2$ layer 18' formed on the relaxed SiGe surface 16. For this embodiment layer 18' is formed preferably by depositing a CVD $SiO_2$ layer to a thickness of between about 10 and 1000 Angstroms. Alternatively, the bonding layer 18' can be formed by thermally oxidizing the SiGe layer 16 to form the $SiO_2$ layer 18'.

Figure 4C:
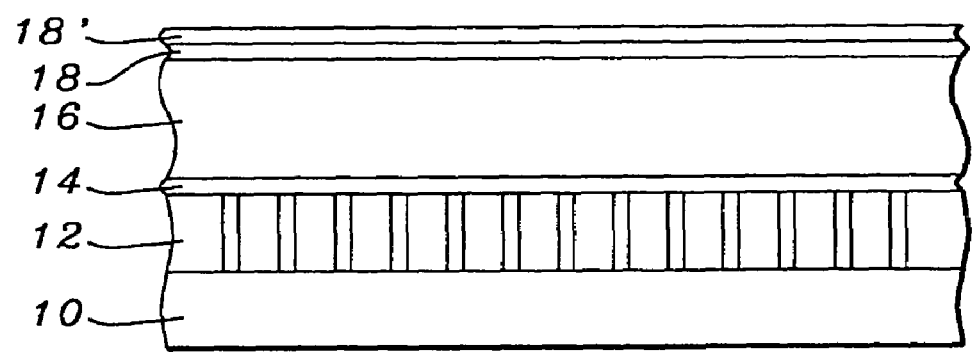
FIG. 4C shows a schematic cross-sectional view of a portion of wafer depicting the process for fabricating a strained Si layer on a SOI wafer by a third embodiment.

Referring to FIG. 4C, a third embodiment of this invention is now described. This embodiment is similar to the first embodiment up through FIG. 4A, except that after forming the bonding epitaxial layer 18, a bonding $SiO_2$ 18' is also formed on the spitaxial layer 18. For this third embodiment the epitaxial layer 18 is formed as in the first embodiment (see FIG. 4A), and to a preferred thickness of about 10 to 10000 Angstroms. The bonding $SiO_2$ layer 18' is formed by depositing a CVD $SiO_2$ layer to a thickness of between about 10 and 1000 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method for making a strained silicon layer on a handle wafer comprising the steps of:
   forming a porous silicon layer on a principal surface of a seed wafer;
   annealing said seed wafer to form a smooth surface on said porous silicon layer;

forming a silicon germanium layer directly on said smooth surface;

forming a first insulating layer on said silicon germanium layer;

bonding said handle wafer having a second insulating layer on a principal surface to said first insulating layer;

cutting said porous silicon layer and separating said handle wafer from said seed wafer, while retaining portions of said porous silicon layer on said handle wafer;

annealing said handle wafer to form said strained silicon layer on said handle wafer.

2. The method of claim 1, wherein said seed wafer is a single-crystal silicon wafer having a crystallographic orientation selected from the group consisting of <100>, <110>, and <111>.

3. The method of claim 1, wherein said porous silicon layer is formed by anodization to a depth of between about 100 and 10000 Angstroms.

4. The method of claim 1, wherein said seed wafer is annealed in hydrogen to form a smooth surface having a thickness of about 2 to 1000 Angstroms on said porous silicon layer.

5. The method of claim 1, wherein said silicon germanium layer is formed on said smooth surface by chemical-vapor deposition, and is formed to a thickness of between about 100 and 100000 Angstroms.

6. The method of claim 1, wherein said first insulating layer is a silicon oxide layer formed to a thickness of between about 10 and 1000 Angstroms.

7. The method of claim 1, wherein said seed wafer is bonded to said handle wafer by a process selected from the group consisting of anodic bonding and electrostatic bonding.

8. The method of claim 1, wherein said seed wafer is separated from said handle wafer by cutting said porous silicon layer using a water-jet splitting process.

9. The method of claim 1, wherein said porous silicon layer on said handle wafer is annealed in hydrogen at a temperature and for a time sufficient to form said strained silicon layer having a thickness of between about 2 and 1000 Angstroms.

10. A method for making a strained silicon layer on a handle wafer comprising the steps of:

forming a porous sacrificial layer on a principal surface of a seed wafer;

annealing said seed wafer to form a smooth surface on said sacrificial layer;

forming a relaxed layer directly on said smooth surface;

forming a first insulating layer on said relaxed layer;

bonding said handle wafer having a second insulating layer on a principal surface to said first insulating layer;

cutting said porous sacrificial layer and separating said handle wafer from said seed wafer, while retaining portions of said porous sacrificial layer on said handle wafer;

annealing said handle wafer to form said strained layer on said handle wafer from the retained portions of said porous sacrificial layer.

11. The method of claim 10 wherein the step of forming a porous sacrificial layer further comprises forming a porous silicon layer.

12. The method of claim 10 wherein the step of forming a sacrificial layer further comprises forming a silicon germanium layer.

13. The method of claim 10 wherein the step of cutting said porous sacrificial layer further comprises cutting the porous sacrificial layer by water-jet splitting.

14. The method of claim 10 wherein the step of annealing said handle wafer to form said strained layer further comprises annealing in ambient hydrogen at a temperature ranging from about 900° to about 1150° Celsius.

15. The method of claim 10 wherein the step of forming a first insulating layer on said relaxed layer further comprises forming an epitaxial silicon layer on said relaxed layer.

16. The method of claim 10 wherein the step of forming a first insulating later on said relaxed layer further comprises forming an $SiO_2$ on said relaxed layer by chemical vapor deposition.

17. The method of claim 10 further comprising forming a bonding layer on said first insulating layer before bonding said handle wafer.

18. A method for making a strained silicon layer on a handle wafer comprising the steps of:

forming a porous silicon layer on a principal surface of a seed wafer by local anodization, wherein said seed wafer is a single-crystal silicon wafer having a crystallographic orientation of <110> for PMOS mobility;

annealing said seed wafer in ambient hydrogen to form a smooth surface on said porous silicon layer;

forming a relaxed silicon germanium layer directly on said smooth surface by epitaxial growth;

forming a first silicon insulating layer on said silicon germanium layer by epitaxial growth;

wafer bonding said handle wafer having a second insulating layer on a principal surface to said first insulating layer;

water-jet cutting said porous silicon layer and separating said handle wafer from said seed wafer, while retaining portions of said porous silicon layer on said handle wafer; and annealing said handle wafer in ambient hydrogen to form said strained silicon layer on said handle wafer from the retained portions of said porous silicon layer.

19. The method of claim 18 wherein the step of forming a porous silicon layer on a principal surface of a seed wafer by local anodization further comprises forming the porous silicon layer in an electrochemical cell, said porous silicon layer being formed to a depth between about 100 and about 10000 Angstroms.

20. The method of claim 18 wherein the step of forming a relaxed silicon germanium layer on said smooth surface by epitaxial growth further comprises forming the silicon germanium layer in the ratio of $Si_xGe_{1-x}$, where x ranges from about 0.05 to about 1.0.

* * * * *

UNITED STATES PATENT AND TRADEMARK OFFICE
CERTIFICATE OF CORRECTION

PATENT NO. : 7,312,136 B2 Page 1 of 1
APPLICATION NO. : 10/899270
DATED : December 25, 2007
INVENTOR(S) : Chien-Chao Huang et al.

It is certified that error appears in the above-identified patent and that said Letters Patent is hereby corrected as shown below:

Column 1, lines 9-11 "Cross-Reference" paragraph should be corrected from:

"This application is a divisional application of U.S. patent application Ser. No. 10/318,454, filed on Dec. 13, 2002, now U.S. Pat. No. 6,812,116, entitled."

to:

"This application is a divisional application of U.S. patent application Ser. No. 10/318,454, filed on Dec. 13, 2002, now U.S. Pat. No. 6,812,116, entitled A METHOD OF FABRICATING A WAFER WITH STRAINED CHANNEL LAYERS FOR INCREASED ELECTRON AND HOLE MOBILITY FOR IMPROVING DEVICE PERFORMANCE, and herein incorporated by reference in its entirety."

Signed and Sealed this

Tenth Day of June, 2008

JON W. DUDAS
*Director of the United States Patent and Trademark Office*